(12) United States Patent   (10) Patent No.: US 8,923,358 B2
Noda et al.                 (45) Date of Patent:     Dec. 30, 2014

(54) TWO-DIMENSIONAL PHOTONIC CRYSTAL SURFACE EMITTING LASER LIGHT SOURCE

(75) Inventors: Susumu Noda, Uji (JP); Yoshitaka Kurosaka, Kyoto (JP); Eiji Miyai, Kyoto (JP); Dai Ohnishi, Kyoto (JP); Wataru Kunishi, Kyoto (JP)

(73) Assignees: Kyoto University, Kyoto (JP); Rohm Co., Ltd., Kyoto (JP)

( * ) Notice: Subject to any disclaimer, the term of this patent is extended or adjusted under 35 U.S.C. 154(b) by 112 days.

(21) Appl. No.: 12/225,530

(22) PCT Filed: Mar. 30, 2007

(86) PCT No.: PCT/JP2007/000340
§ 371 (c)(1),
(2), (4) Date: Oct. 22, 2008

(87) PCT Pub. No.: WO2007/116584
PCT Pub. Date: Oct. 18, 2007

(65) Prior Publication Data
US 2009/0175304 A1   Jul. 9, 2009

(30) Foreign Application Priority Data
Mar. 31, 2006   (JP) ................................ 2006-097651

(51) Int. Cl.
H01S 3/08    (2006.01)
H01S 5/183   (2006.01)
H01S 5/10    (2006.01)

(52) U.S. Cl.
CPC ..... *H01S 5/183* (2013.01); *H01S 5/105* (2013.01)
USPC .......................................... 372/99; 372/102

(58) Field of Classification Search
CPC .............................. H01S 5/1042; H01S 5/105
USPC .................................................. 372/99, 102
See application file for complete search history.

(56) References Cited

U.S. PATENT DOCUMENTS

2007/0280318 A1 * 12/2007 Yoshimoto et al. ........ 372/43.01

FOREIGN PATENT DOCUMENTS

| CA | 2 521 005 A1 | 10/2004 |
| EP | 1 610 427 A1 | 12/2005 |
| JP | A-2000-332351 | 11/2000 |
| JP | A-2003-23193 | 1/2003 |
| JP | A-2004-296538 | 10/2004 |

OTHER PUBLICATIONS

Noda et al.; "Polarization Mode Control of Two-Dimensional Photonic Crystal Laser by Unit Cell Structure Design;" *Science*; vol. 293; 2001; pp. 1123-1125.
Miyai et al.; "Phase-shift effect on a two-dimensional surface-emitting photonic-crystal laser;" *Applied Physics Letters*; vol. 86; 2005; pp. 111113-1-111113-3.
Feb. 18, 2013 Taiwanese Office Action issued in Application No. 096110503.

\* cited by examiner

*Primary Examiner* — Tod T Van Roy
(74) *Attorney, Agent, or Firm* — Oliff PLC

(57) ABSTRACT

A two-dimensional photonic crystal surface emitting laser light source includes a two-dimensional photonic crystal made of a plate-shaped body material provided with a periodic arrangement of identically-shaped holes and an active layer. The hole is not located on a first half-line extending from the gravity center of the hole, while the hole is located on a second half-line extending in the direction opposite to the first half-line. Injecting electric charges into the active layer generates light, which creates an electric field encircling the gravity center. For a given point on the second half-line where the hole is located, there is no hole at a point that is symmetrical to the aforementioned point with respect to the gravity center, so that the electric field vectors at the two points do not cancel each other and the laser light is stronger than conventional examples.

4 Claims, 3 Drawing Sheets

TWO-DIMENSIONAL PHOTONIC CRYSTAL SURFACE EMITTING LASER LIGHT SOURCE

TECHNICAL FIELD

The present invention relates to a two-dimensional photonic crystal surface emitting laser light source which emits laser light in a direction perpendicular to the surface of a flat light source.

BACKGROUND ART

In recent years, new types of laser light sources using a photonic crystal have been developed. A photonic crystal consists of a dielectric body material in which an artificial periodic structure is created. Usually, the periodic structure is created by providing the body material with a periodic arrangement of areas whose refractive index differs from that of the body material (this area is hereinafter called the "modified refractive index area"). The periodic structure causes a Bragg diffraction within the crystal and creates an energy band gap for the energy of light. There are two types of photonic crystal laser light sources: one utilizes a band-gap effect to make a point-like defect function as a resonator, and the other utilizes a standing wave at a band edge where the group velocity of light becomes zero. Each of these devices causes a laser oscillation by amplifying light of a predetermined wavelength.

Patent Document 1 discloses a laser light source in which a two-dimensional photonic crystal is created in the vicinity of an active layer containing a luminescent material. The two-dimensional photonic crystal includes a plate-shaped semiconductor body in which cylindrical holes are periodically arranged (e.g. in a triangular, square or hexagonal lattice pattern) so as to provide the crystal with a two-dimensional, periodic distribution of refractive index. Its period is adjusted so that it equals the wavelength of light to be generated within the active layer by an injection of carriers from an electrode. As a result, a two-dimensional standing wave is produced within the two-dimensional photonic crystal, whereby the light is strengthened to produce a laser oscillation. The laser light thereby produced is diffracted by the two-dimensional photonic crystal to a direction perpendicular to the same crystal. Thus, a two-dimensional emission of light from the surface of the two-dimensional photonic crystal is obtained.

FIG. 1 shows a calculated result of the electromagnetic distribution of a standing wave created within the two-dimensional photonic crystal with holes 11 arranged in a square lattice pattern in the laser light source disclosed in Patent Document 1. Thick circles 11 in FIG. 1 each indicate the hole 11, the gray shading represents the magnetic field strength, and the direction and length of the arrows respectively indicate the direction and magnitude of the electric field. The electric field encircles the (gravity) center of each hole 11 and is anti-symmetrical with respect to the gravity center. If the two-dimensional photonic crystal has an infinite extent, the anti-symmetry of the electric field will result in the cancellation of the electric field at every hole due to interference (destructive interference), so that the laser light will not be emitted to the outside.

Actually, the extent of the two-dimensional photonic crystal is finite. Therefore, the anti-symmetry is broken and the electric field cannot be completely cancelled, so that a portion of the laser light generated within the two-dimensional photonic crystal will be emitted to the outside. However, the laser light to be emitted to the outside is weakened due to the influence of the interference of the electric field.

Patent Document 2 discloses a surface emitting laser light source having a two-dimensional photonic crystal in which the lattice structure, which is decided by the combination of the lattice pattern and the shape of the modified refractive index area, is translationally but not rotationally symmetrical. One example of such a two-dimensional photonic crystal is the one in which the rotational symmetry of the lattice differs from that of the modified refractive index areas, as in the case where the modified refractive index areas are arranged in a square lattice pattern and their shape is an equilateral triangle. The two-dimensional photonic crystal in this surface emitting laser light source is structurally less symmetrical than the one disclosed in Patent Document 1, so that the destructive interference is less influential. As a result, the light emitted perpendicularly to the crystal surface becomes stronger.

Patent Document 1: Japanese Unexamined Patent Application Publication No. 2000-332351 (Paragraphs [0037] to [0056]; FIG. 1)

Patent Document 2: Japanese Unexamined Patent Application Publication No. 2004-296538 (Paragraphs [0026] to [0037] and [0046]; FIGS. 1 to 5 and 22)

DISCLOSURE OF THE INVENTION

Problem to be Solved by the Invention

Thus, the two-dimensional photonic crystal disclosed in Patent Document 2 can decrease the influence of destructive interference to produce a somewhat stronger emission of laser light. However, a surface emitting laser light source capable of producing an even stronger laser light is currently demanded.

Accordingly, an objective of the present invention is to provide a surface emitting laser light source that can produce a laser light stronger than conventional examples.

Means for Solving the Problems

To solve the aforementioned problem, the present invention provides a two-dimensional photonic crystal surface emitting laser light source, including:

a two-dimensional photonic crystal made of a plate-shaped body material provided with a periodic arrangement of identically-shaped areas having a refractive index different from that of the body material; and an active layer provided on one side of the two-dimensional photonic crystal, characterized in that:

in each modified refractive index area, no part of the modified refractive index area lies on a gravity center thereof and on a first half-line extending from the gravity center in a direction within a plane of the two-dimensional photonic crystal, while a part of the modified refractive index area lies on a second half-line extending from the gravity center in a direction opposite to the first half-line.

For example, the modified refractive index area may consist of a V-shaped area or a triangular arrangement of three identically-shaped areas having a refractive index different from that of the body material.

Effect of the Invention

In the two-dimensional photonic crystal surface emitting laser light source according to the present invention, the body material and not the modified refractive index area is located on the first half-line extending from one side of the gravity center of the modified refractive index area, whereas the modified refractive index area is located at least on a portion of the second half-line extending from the other side. The electric field of the standing wave formed at a point on the second half-line, where the modified refractive index area is located, differs in strength from the electric field of the standing wave formed at a point that is symmetrical to the aforementioned point with respect to the gravity center, due to the difference in the refractive index (or dielectric constant) between the two points. Thus, the destructive interference is prevented, so that the laser light generated within the two-dimensional photonic crystal can be extracted in a direction perpendicular to the crystal with a greater strength than in the case of using conventional two-dimensional photonic crystal surface emitting laser light sources.

Figure 1:
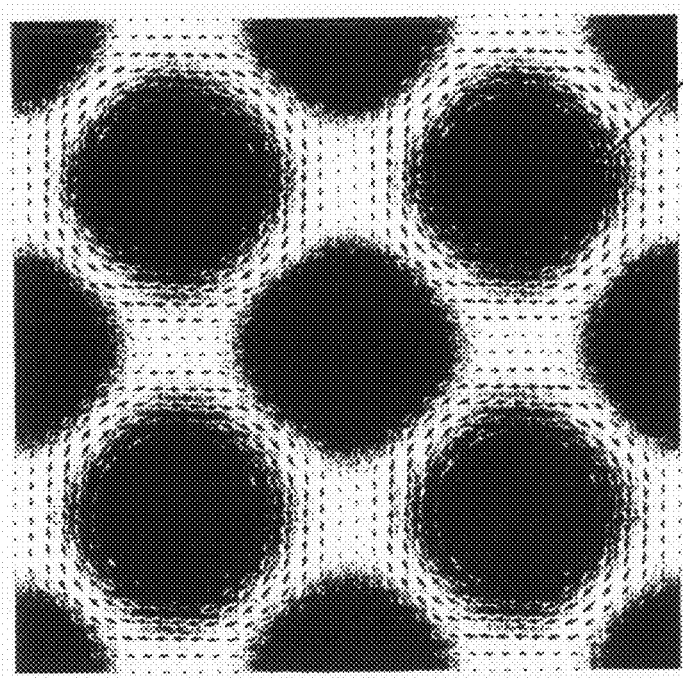
FIG. 1 is a graphic illustrating a calculated result of an electromagnetic field within the two-dimensional photonic crystal in a conventional two-dimensional photonic crystal surface emitting laser light source.

EXPLANATION OF NUMERALS 11, 242A, 242B . . . Hole
21 . . . Upper Substrate
22 . . . Cladding Layer
23 . . . Active Layer
24, 24A, 24B . . . Two-Dimensional Photonic Crystal
241 . . . Body Material
25 . . . Cladding Layer
251 . . . First Half-Line
252 . . . Second Half-Line
26 . . . Lower Substrate
261, 262, 263 . . . Hole Component
27 . . . Upper Electrode
271 . . . Window
28 . . . Lower Electrode
291, 292 . . . Electric Field Vector
G1, G2 . . . Gravity Center

BEST MODE FOR CARRYING OUT THE INVENTION

The two-dimensional photonic crystal surface emitting laser light source according to the present invention has a two-dimensional photonic crystal provided on one side of an active layer. The two-dimensional photonic crystal does not need to be in direct contact with the active layer; it is possible to have a spacer or similar member located between them. The active layer is a layer that emits light having wavelengths including that of an intended laser light when an electric current is injected into it, and this layer may be the same as those conventionally used in conventional Fabry-Perot laser light sources.

As in the conventional surface emitting lasers, the two-dimensional photonic crystal is a plate-shaped body material in which modified refractive index areas (i.e. the areas whose refractive index differs from that of the body material) are periodically arranged to create a periodic distribution of refractive index. The arrangement pattern of the modified refractive index areas may be a square lattice, triangular lattice or any other patterns used in conventional surface emitting lasers. The modified refractive index areas are identically shaped. The modified refractive index areas should preferably consist of holes since this structure provides a large difference in the refractive index between the body and the modified refractive index area and yet is easy to manufacture. However, it is also possible to create the modified refractive index areas by embedding appropriate members into the body material. For example, in the case where the two-dimensional photonic crystal needs to be fused to another layer at a high temperature, the modified refractive index area consisting of an embedded member can be suitably used to prevent the high temperature from deforming the modified refractive index area. The modified refractive index area consisting of an embedded member can also be created by forming the members, arranging them in a specific pattern, and filling the space around them with the body material.

The shape of the modified refractive index areas in the present invention should satisfy the following conditions: First, the modified refractive index areas should be shaped so that the gravity center of each modified refractive index area is outside the modified refractive index area. In other words, the modified refractive index area should not be located at the gravity center. Second, the modified refractive index area should not be located on a half-line (the first half-line) extending from the gravity center in a specific direction within the plane of the two-dimensional photonic crystal. This half-line may extend in any direction regardless of the direction of the lattice pattern in which the modified refractive index areas are arranged. Third, at least a portion of the modified refractive index area should be located on a second half-line extending from the gravity center in the direction opposite to the first half-line (i.e. in a direction turned by 180°). One example of such a modified refractive index area is a V-shaped area, and another example is a triangular arrangement of three identically-shaped areas having a refractive index different from that of the body material.

Shaping the modified refractive index area in this manner results in a difference in the refractive index between any two points that are symmetrical with respect to the gravity center on a straight line consisting of the first and second half-lines (i.e. the refractive index of the body material on one side, versus that of the modified refractive index area on the other side). This feature at least applies to a portion of the line. As already explained, the electric field vectors of a standing wave of light created within the two-dimensional photonic crystal encircle the gravity center of each modified refractive index area. However, the difference in the refractive index eliminates the anti-symmetry of electric field vectors between the aforementioned two points, so that the destructive interference is prevented. Accordingly, the light extracted perpendicularly to the two-dimensional photonic crystal becomes stronger than conventional examples.

The shape of the modified refractive index area in conventional two-dimensional photonic crystal surface emitting laser light sources was circular, elliptical, equilateral-triangular, isosceles-triangular, right-triangular, rivet-shaped, hook-shaped, a combination of large and small circles, and so on (the circular example is disclosed in Patent Document 1, the others in Patent Document 2). In all of these cases, the gravity center is located inside the modified refractive index area. This means that the modified refractive index area is found in any direction around the gravity center. Therefore, in these conventional surface emitting laser light sources, any two points that are symmetrical with respect to the gravity center have the same refractive index at least in the vicinity of the gravity center. Therefore, the electric field vectors at the two points are anti-symmetrical to each other, so that the electric fields at the points cancel each other due to destructive interference. As described earlier, this destructive interference is prevented in the present invention, so that a laser light stronger than those generated by conventional two-dimensional photonic crystal surface emitting laser light sources can be extracted.

The usage of the two-dimensional photonic crystal surface emitting laser light source according to the present invention is similar to that of the conventional ones; i.e. injecting an electric current into the active layer generates laser light.

When the electric current is injected into the active layer, rays of light having a wavelength band including that of the objective laser light are emitted from the active layer. Among these rays of light, the light having a wavelength corresponding to the period of the two-dimensional photonic crystal forms a two-dimensional standing wave within the same crystal and is thereby strengthened into a laser oscillation. This laser light is extracted perpendicularly to the two-dimensional photonic crystal.

Embodiment

An embodiment of the two-dimensional photonic crystal surface emitting laser light source according to the present invention (which is hereinafter simply called the "surface emitting laser") is described with reference to FIGS. 2 to 6.

Figure 2:
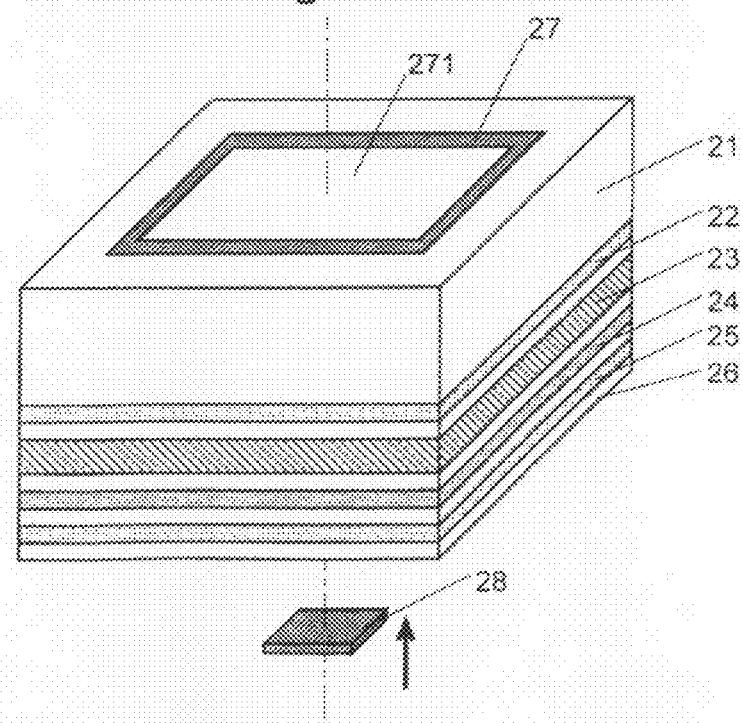
FIG. 2 is a perspective view of an embodiment of the two-dimensional photonic crystal surface emitting laser light source according to the present invention.
Figure 3:
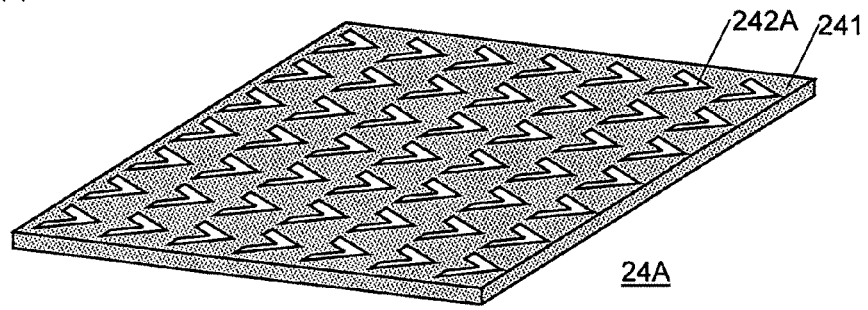
FIGS. 3(a) and 3(b) are perspective views showing two-dimensional photonic crystals in the present embodiment.
Figure 3:
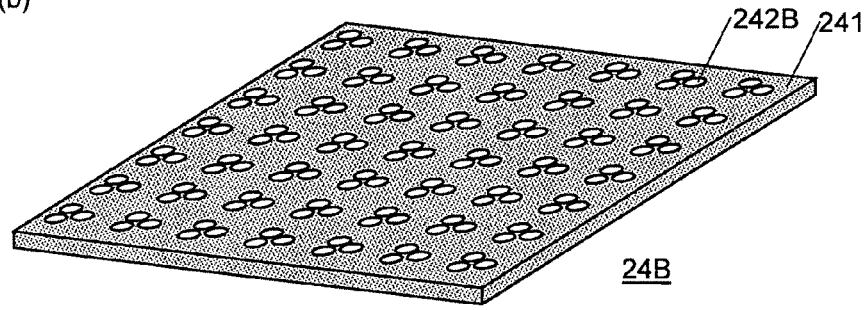
Figure 4:
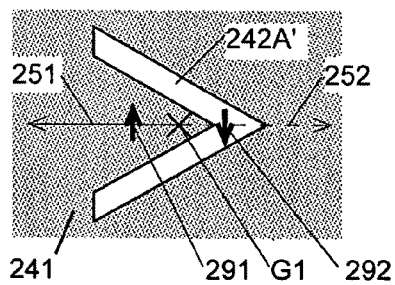
FIGS. 4(a) and 4(b) are plan views showing the holes formed in the two-dimensional photonic crystals in the present embodiment.
Figure 4:
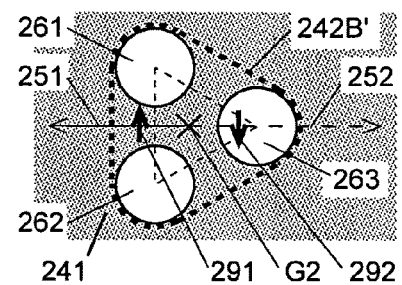
Figure 5:
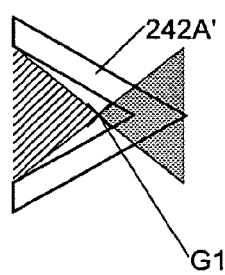
FIGS. 5(a) and 5(b) are plan views showing the areas that satisfy the requirements of the first and second half-lines inside the hole of the two-dimensional photonic crystal in the present invention.
Figure 5:
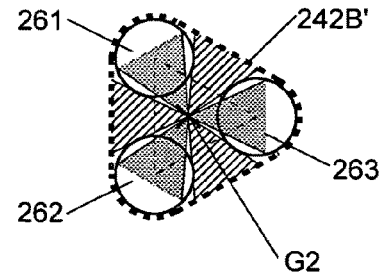
Figure 6:
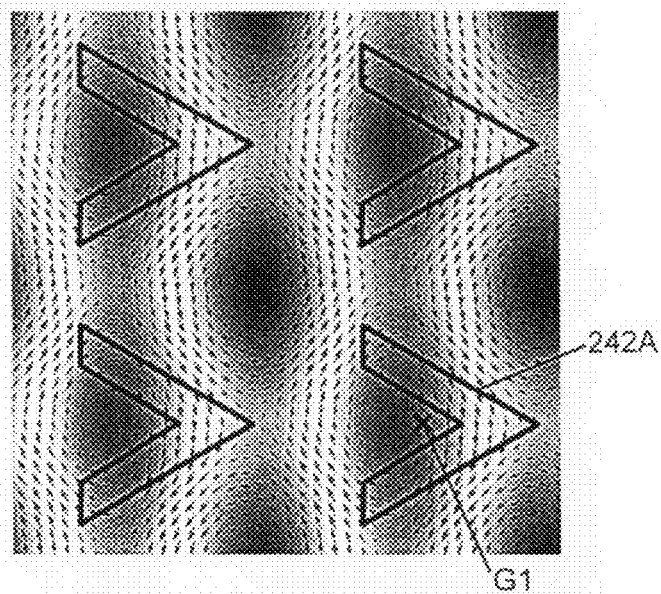
FIGS. 6(a) and 6(b) are graphics each showing a calculated result of an electromagnetic field to be created within the two-dimensional photonic crystal in the present embodiment.
Figure 6:
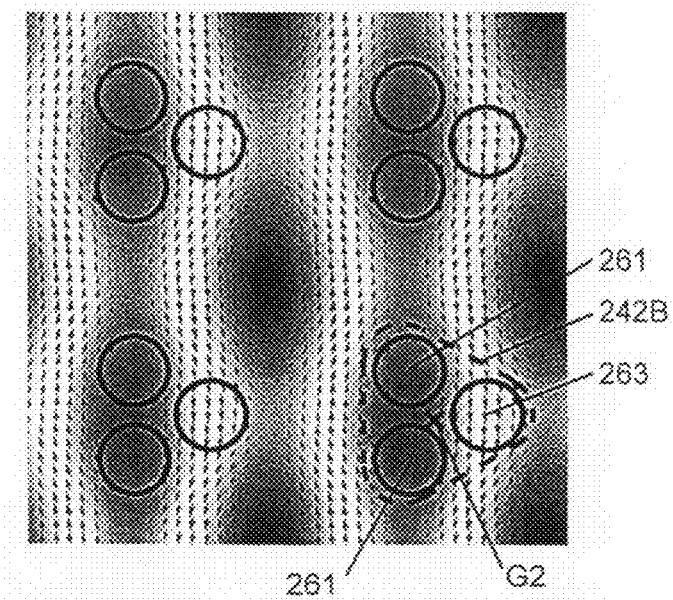

FIG. 2 is a perspective view of the laser light source in the present embodiment. This laser light source includes an upper substrate 21 made of an n-type semiconductor of gallium arsenide (GaAs), under which an active layer 23 having multiple-quantum wells (MQW) made of indium gallium arsenide (InGaAs)/gallium arsenide (GaAs) is located, with a cladding layer 22 made of an n-type semiconductor of aluminum gallium arsenide (AlGaAs) in between. Under the active layer 23 is a two-dimensional photonic crystal 24. The structure of the two-dimensional photonic crystal layer 24 will be described later. Located under this two-dimensional photonic crystal layer 24 is a lower substrate 26 made of p-GaAs, with a cladding layer 25 made of p-AlGaAs in between.

An upper electrode 27 is provided on the upper substrate 21, and a lower electrode 28 beneath the lower substrate 28. The upper electrode 27 has a window 271 for allowing the passage of laser light emitted from the surface emitting laser in the present embodiment. The area of the lower electrode 28 is smaller than that of the upper electrode 27 inclusive of the window 271. The distance between the lower electrode 28 and active layer 23 is smaller than that between the upper electrode 27 and active layer 23. Such designs of the upper and lower electrodes 27 and 28 result in a focused flow of electric current through a small area within the active layer 23 and thereby increase the current density within that area when a voltage is applied between the electrodes 27 and 28, whereby light having an adequate strength for laser oscillation is generated from the active layer 23. The aforementioned designs also improve the heat-releasing efficiency from the active layer 23 to the lower substrate 26 or other components.

It should be noted that the active layer 23 and two-dimensional photonic crystal 24 may be transposed. The use of "upper", "lower" and similar expressions in the present description is just for the sake of convenience and should not be interpreted as restricting the direction of the surface emitting laser in the present embodiment.

The configuration of the two-dimensional photonic crystal 24 in the surface emitting laser of the present embodiment is hereinafter described. In the present embodiment, two types of two-dimensional photonic crystals 24A and 24B shown in FIGS. 3(a) and 3(b) are used. Each of the two-dimensional photonic crystals 24A and 24B consists of a plate-shaped body material 241 made of p-GaAs with holes (i.e. modified refractive index areas) arranged in a square lattice pattern.

The holes 242A arranged in the two-dimensional photonic crystal 24A are V-shaped. One of these holes 242A is shown as the hole 242A' in FIG. 4(a). As shown, the hole 242A' is not located at the gravity center G1 of the hole 242A'; instead, p-GaAs of the body material 241 is located. Nor is the hole 242A' located on the first half-line 251 extending leftward from the gravity center G1. On the other hand, the second half-line 252 extending from the gravity center G1 in the direction opposite to the first half-line 251 passes through the hole 242A'. That is to say, the hole 242A' is located on a portion of the second half-line 252.

In the two-dimensional photonic crystal 24A, as shown by the thick arrows in FIG. 4(a), the electric field vector 292 created within the hole 242A on the second half-line 252 is not anti-symmetrical to the electric field vector 291 created within the body material 241 at a point that is symmetrical to the electric field vector 292 with respect to the gravity center G1. This is because there is a difference in the refractive index between the points where the two vectors are located. Therefore, the two electric field vectors 291 and 292 are prevented from destructive interference.

One of the holes 242B arranged in the two-dimensional photonic crystal 24B is shown as the hole 242B' in FIG. 4(b). This hole 242B' consists of three hole components 261, 262 and 263, each of which is a circular hole and arranged at each apex of an equilateral triangle (shown by a thin broken line). In the present two-dimensional photonic crystal 24B, the three hole components 261 to 263 integrally function as the single modified refractive index area (hole) 242B'. The gravity center G2 of the hole 242B' coincides with that of the equilateral triangle drawn by the thin broken line. None of the hole components 261 to 263 are located at the gravity center G2; instead, p-GaAs of the body material 241 is located. Nor are the hole components 261 to 263 located on the first half-line 251 extending leftward from the gravity center G2. On the other hand, the second half-line 252 extending in the direction opposite to the first half-line 251 passes through the hole component 263. That is to say, the hole 242B' is located on a portion of the second half-line 252.

Similar to the two-dimensional photonic crystal 24A, in the two-dimensional photonic crystal 24B, the electric field vector 292 created within the hole 242B on the second half-line 252 is not anti-symmetrical to the electric field vector 291 created within the body material 241 at a point that is symmetrical to the electric field vector 292 with respect to the gravity center G1, so that the two electric field vectors 291 and 292 are prevented from destructive interference.

In the previous example, the hole components 261 to 263 constituting one hole were arranged at the apexes of an equilateral triangle. Alternatively, the hole components 261 to 263 may be arranged at the apexes of a different kind of triangle other than the equilateral triangle. This hole configuration also enables a two-dimensional photonic crystal to yield the same effect as the two-dimensional photonic crystal 24B.

Although FIGS. 4(a) and 4(b) both show only one pair of half-lines 251 and 252, any half-line that extends from the gravity center and passes through the hatched area in FIG. 5(a) or 5(b) actually satisfies the requirements of the first half-line. Similarly, any half-line that extends opposite to the first half-line passes through the shaded area in FIG. 5(a) or 5(b) and hence satisfies the requirements of the second half-line since the hole is located on it. Thus, the area where the destructive interference is prevented is widely spread on the two-dimensional photonic crystal.

As just described, destructive interference is prevented over a wide range within the two-dimensional photonic crystal; the electric field vectors at any two points that are symmetrical with respect to the gravity center do not completely cancel each other. Therefore, the laser light generated by oscillation within the two-dimensional photonic crystal can be extracted from the window 271 of the upper electrode 27 with a greater strength than in the conventional case.

FIGS. 6(a) and 6(b) each show the result of a two-dimensional FDTD calculation of the electromagnetic field distribution created within the two-dimensional photonic crystals in the present embodiment. Similar to FIGS. 1(a) and 1(b), the gray shading represents the magnetic field strength, and the direction and length of the arrows respectively indicate the direction and magnitude of the electric field. Specifically, FIG. 6(a) shows the calculated result for the two-dimensional photonic crystal 24A, and FIG. 6(b) for the two-dimensional photonic crystal 24B. In the two-dimensional photonic crystal 24A, the electric field at any point inside the hole 242A on the right side of the gravity center G1 is stronger than the electric field at a point that is symmetrical to the aforementioned point inside the hole 242A with respect to the gravity center G1. In the two-dimensional photonic crystal 24B, the electric field inside the hole component 261 and 262 is weaker than that at the points that are symmetrical to the hole component 261 and 262 with respect to the gravity center G2. It should also be stated that the electric field in the hole component 263 is stronger than that at the points that are symmetrical to the hole component 263 with respect to the gravity center G2. Thus, in the present embodiment, the electric fields are asymmetrical with respect to the gravity center, so that the destructive interference is less influential and a strong laser light results.

For each of the cases where the two-dimensional photonic crystals 24A and 24B were used, the $\alpha_\perp$ value was calculated. This value indicates the proportion of the wave number component emitting in the direction perpendicular to the surface among the components obtained by a Fourier transformation of the in-plane electric field distribution of the photonic crystal layer calculated by the two-dimensional FDTD method. A larger $\alpha_\perp$ value indicates a stronger emission of light in the direction perpendicular to the two-dimensional crystal. For comparison, the same value was calculated for a conventional surface emitting laser using a two-dimensional photonic crystal with equilateral-triangular holes arranged in a square lattice pattern. The result was that, with $\alpha_\perp=1$ for the conventional surface emitting laser, $\alpha_\perp=7.1$ for the surface emitting laser using the two-dimensional photonic crystal 24A and $\alpha_\perp=14.9$ for the device using the two-dimensional photonic crystal 24B. This result has confirmed that the surface emitting laser in the present embodiment can emit a laser light that is stronger than that generated by the conventional one.

It should be naturally understood that the shape of the modified refractive index area (e.g. hole) in the present invention is not limited to the ones described in the previous embodiment; as already explained, any shape is allowed as long as the modified refractive index area is not located on the first half-line, while the modified refractive index area is located at least on a portion of the second half-line. The arrangement pattern of the modified refractive index areas, which was a square lattice pattern in the previous embodiment, may be a triangular, oblique or rectangular lattice pattern or any other pattern. The active layer, cladding layer, electrodes and other components, except the two-dimensional photonic crystal, are not limited to ones described in the previous embodiment but may be directly replaced by those used in conventional two-dimensional photonic crystal surface emitting lasers.

The invention claimed is:

1. A two-dimensional photonic crystal surface emitting laser light source, including:
    a two-dimensional photonic crystal consisting of:
    a plate-shaped body; and
    a plurality of identically-shaped and separately distributed modified refractive index areas periodically arranged in a square lattice pattern or in a rectangular lattice pattern each of the plurality of modified refractive index areas being composed of one or more identically-shaped elements having a refractive index different from that of the body; and
    an active layer provided on one side of the two-dimensional photonic crystal, wherein:
    for each of the plurality of modified refractive index areas, the one or more elements are not present at a gravity center thereof and on a first half-line extending from the gravity center in a direction within a plane of the two-dimensional photonic crystal, while the one or more elements are present at least on a portion of a second half-line extending from the gravity center in a direction opposite to the first half-line.

2. The two-dimensional photonic crystal surface emitting laser light source according to claim 1, wherein the modified refractive index area is V-shaped.

3. The two-dimensional photonic crystal surface emitting laser light source according to claim 1, wherein the modified refractive index area is a triangular arrangement of three identically-shaped areas having a refractive index different from that of the body.

4. The two-dimensional photonic crystal surface emitting laser light source according to claim 3, wherein each of the three identically-shaped areas is arranged at each apex of an equilateral triangle.

* * * * *